(12) United States Patent
Nagai et al.

(10) Patent No.: US 10,631,370 B2
(45) Date of Patent: Apr. 21, 2020

(54) MEMBER FOR SEMICONDUCTOR MANUFACTURING APPARATUS, METHOD FOR PRODUCING THE SAME, AND HEATER INCLUDING SHAFT

(71) Applicant: NGK INSULATORS, LTD., Nagoya (JP)

(72) Inventors: Asumi Nagai, Okazaki (JP); Noboru Nishimura, Nagoya (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 672 days.

(21) Appl. No.: 15/298,660

(22) Filed: Oct. 20, 2016

(65) Prior Publication Data

US 2017/0127475 A1    May 4, 2017

(30) Foreign Application Priority Data

Oct. 30, 2015  (JP) ................. 2015-214956
Sep. 28, 2016  (JP) ................. 2016-189843

(51) Int. Cl.
| | |
|---|---|
| *H05B 3/00* | (2006.01) |
| *H05B 3/06* | (2006.01) |
| *H01L 21/67* | (2006.01) |
| *H01L 21/687* | (2006.01) |
| *H05B 3/28* | (2006.01) |

(52) U.S. Cl.
CPC .......... *H05B 3/06* (2013.01); *H01L 21/67103* (2013.01); *H01L 21/68757* (2013.01); *H01L 21/68792* (2013.01); *H05B 3/283* (2013.01); *H05B 2203/017* (2013.01)

(58) Field of Classification Search
CPC ............................ H05B 3/06; H01L 21/67103

USPC ............. 219/444.1, 542–548; 118/724–729; 29/611

See application file for complete search history.

(56) References Cited

U.S. PATENT DOCUMENTS

| | | |
|---|---|---|
| 2005/0160989 A1 | 7/2005 | Kuibira et al. |
| 2011/0229719 A1* | 9/2011 | Nishiguchi ............. C30B 23/00 428/408 |

(Continued)

FOREIGN PATENT DOCUMENTS

JP    4311910 B2    8/2009

OTHER PUBLICATIONS

Lai et al., "Effect of Oxygen on Sintering of Aluminium Nitride with $Y_2O_3$ Sintering Aid" Oct. 19, 1994, Journal of the Ceramic Society of Japan. (Year: 1994).*

(Continued)

*Primary Examiner* — Viet Le
(74) *Attorney, Agent, or Firm* — Burr & Brown, PLLC

(57) ABSTRACT

A member for a semiconductor manufacturing apparatus according to the present invention is a member that is to be joined to an aluminum nitride base member. The member is composed of a composite material including principal constituent phases that are aluminum nitride and a pseudopolymorph of aluminum nitride which includes silicon, aluminum, oxygen, and nitrogen. The pseudopolymorph of aluminum nitride has at least one periodic structure selected from a 27R phase and a 21R phase or an X-ray diffraction peak at least at $2\theta=59.8°$ to $60.8°$. The composite material has a thermal conductivity of 50 W/mK or less at room temperature.

26 Claims, 10 Drawing Sheets

(56) References Cited

U.S. PATENT DOCUMENTS

| | | | | |
|---|---|---|---|---|
| 2013/0161305 A1* | 6/2013 | Ptasienski | ............... | H05B 3/20 |
| | | | | 219/201 |
| 2015/0016083 A1* | 1/2015 | Nootens | ............... | H01C 17/00 |
| | | | | 361/820 |
| 2016/0083840 A1* | 3/2016 | Rao | .................... | C23C 16/4581 |
| | | | | 219/444.1 |
| 2016/0093521 A1* | 3/2016 | Du Bois | ............ | C23C 16/4585 |
| | | | | 438/795 |
| 2016/0099163 A1* | 4/2016 | Nasu | ............... | H01L 21/67103 |
| | | | | 219/444.1 |
| 2016/0104634 A1* | 4/2016 | Lee | .................. | H01L 21/67109 |
| | | | | 219/444.1 |
| 2016/0126125 A1* | 5/2016 | Okugawa | ......... | H01L 21/67103 |
| | | | | 219/444.1 |
| 2016/0145742 A1* | 5/2016 | Janakiraman | .... | C23C 16/45565 |
| | | | | 118/728 |
| 2016/0172226 A1* | 6/2016 | West | ...................... | C23C 16/46 |
| | | | | 438/782 |

OTHER PUBLICATIONS

Yijun et al., "Effects of Behaviors of Aluminum Nitride Ceramics with Rare Earth Oxide Additives", Jun. 2007, Journal of Rare Earths. (Year: 2007).*

Zangvil et al., "Phase Relationships in Silicon Carbide-Aluminum Nitride System", 1988 (Year: 1988).*

Shveikin et al., "SIALONS—Promising Refractory and Ceramic Materials" Nov. 2002, Refractories and Industrial Ceramics (Year: 2002).*

* cited by examiner

MEMBER FOR SEMICONDUCTOR MANUFACTURING APPARATUS, METHOD FOR PRODUCING THE SAME, AND HEATER INCLUDING SHAFT

BACKGROUND OF THE INVENTION

1. Field of the Invention

The present invention relates to a member for a semiconductor manufacturing apparatus, a method for producing the member, and a heater including a shaft.

2. Description of the Related Art

Heaters including a shaft which are constituted by a ceramic wafer-holding unit including a resistance heating element and by a support that supports the wafer-holding unit are known. There has been proposed a heater including a shaft in which the support has a lower thermal conductivity than the wafer-holding unit (see PTL 1). Specifically, there has been disclosed a heater including a shaft which is constituted by an AlN wafer-holding unit having a thermal conductivity of 170 W/mK and by an AlN support having a thermal conductivity of 80 W/mK or a mullite support having a thermal conductivity of 4 W/mK which is glass-bonded to the wafer-holding unit. The difference in thermal expansion coefficient between the wafer-holding unit and the support is 0.1 to 0.5 ppm/° C. It is described that the thermal uniformity of the entire surface of the holding member on which a wafer is to be supported was confirmed to be within±0.5%.

CITATION LIST

Patent Literature

[PTL 1] Japanese Patent No. 4311910

SUMMARY OF THE INVENTION

However, the heater including a shaft which was constituted by an AlN wafer-holding unit having a thermal conductivity of 170 W/mK and an AlN support having a thermal conductivity of 80 W/mK which was glass-joined to the wafer-holding unit was not considered to have sufficiently high thermal uniformity. Although the heater including a shaft which was constituted by an AlN wafer-holding unit having a thermal conductivity of 170 W/mK and a mullite support having a thermal conductivity of 4 W/mK which was glass-joined to the wafer-holding unit had high thermal uniformity, the mullite support disadvantageously had low corrosion resistance. Since mullite contains a silicon constituent having considerably low resistance to a halogen gas, in particular, etching of the support may occur during use and particles may be generated from the support.

The present invention was made in order to address the above issues. A main object of the present invention is to provide a member for a semiconductor manufacturing apparatus which, when being joined to an aluminum nitride base member, enhances the thermal uniformity of the aluminum nitride base member to a sufficient degree and has high corrosion resistance.

A first member for a semiconductor manufacturing apparatus according to the present invention is a member for a semiconductor manufacturing apparatus which is to be joined to an aluminum nitride base member, the member being composed of a composite material including principal constituent phases that are aluminum nitride and a pseudopolymorph of aluminum nitride, the pseudopolymorph of aluminum nitride including silicon, aluminum, oxygen, and nitrogen, the pseudopolymorph of aluminum nitride having at least one periodic structure selected from a 27R phase and a 21R phase, the composite material having a thermal conductivity of 50 W/mK or less at room temperature.

Since the first member for a semiconductor manufacturing apparatus includes a pseudopolymorph of aluminum nitride which has the 27R phase and/or the 21R phase having a low thermal conductivity, it has a low thermal conductivity of 50 W/mK or less at room temperature. This reduces the amount of heat that dissipates from the aluminum nitride base member into the member for a semiconductor manufacturing apparatus when the member for a semiconductor manufacturing apparatus is joined to the aluminum nitride base member. Accordingly, the first member for a semiconductor manufacturing apparatus enhances the thermal uniformity of the aluminum nitride base member to a sufficient degree. In other words, the heat dissipating from the aluminum nitride base member into the member for a semiconductor manufacturing apparatus can be blocked. In addition, the pseudopolymorph has a thermal expansion coefficient close to that of the aluminum nitride base member. This makes it easy to control the thermal expansion coefficient of the composite material to be close to that of the aluminum nitride base member. Furthermore, the first member for a semiconductor manufacturing apparatus has higher corrosion resistance than a member containing a large amount of silicon constituent, such as mullite. Note that, the expression "including principal constituent phases that are aluminum nitride and a pseudopolymorph of aluminum nitride" used herein means that, among the constituent phases of the composite material determined by XRD profile analysis, the peak intensity corresponding to one of aluminum nitride and a pseudopolymorph of aluminum nitride is the highest and the other is the second highest. The term "periodic structure" used herein refers to a hexagonal layered structure constituted by layers containing Al or containing Al and Si and by layers containing N or containing N and O that are stacked on top of one another in a specific order.

A second member for a semiconductor manufacturing apparatus according to the present invention is a member for a semiconductor manufacturing apparatus which is to be joined to an aluminum nitride base member, the member being composed of a composite material including principal constituent phases that are aluminum nitride and a pseudopolymorph of aluminum nitride, the pseudopolymorph of aluminum nitride including silicon, aluminum, oxygen, and nitrogen, the pseudopolymorph of aluminum nitride having an X-ray diffraction peak at least at 2θ=59.8° to 60.8°, the composite material having a thermal conductivity of 50 W/mK or less at room temperature.

Since the second member for a semiconductor manufacturing apparatus includes a low-thermal conducting pseudopolymorph of aluminum nitride which has an X-ray diffraction peak at least at 2θ=59.8° to 60.8°, it has a low thermal conductivity of 50 W/mK or less at room temperature. This reduces the amount of heat that dissipates from the aluminum nitride base member into the member for a semiconductor manufacturing apparatus when the member for a semiconductor manufacturing apparatus is joined to the aluminum nitride base member. Accordingly, the second member for a semiconductor manufacturing apparatus enhances the thermal uniformity of the aluminum nitride base member to a sufficient degree. In other words, the heat dissipating from the aluminum nitride base member into the member for a semiconductor manufacturing apparatus can be blocked. In addition, the pseudopolymorph has a thermal expansion coefficient close to that of the aluminum nitride base member. This makes it easy to control the thermal expansion coefficient of the composite material to be close to that of the aluminum nitride base member. Furthermore, the second member for a semiconductor manufacturing apparatus has higher corrosion resistance than a member containing a large amount of silicon constituent, such as mullite.

The term "pseudopolymorph" used herein refers to a material having a structure based on the crystal structure of AlN (2H) in which some Al atoms are replaced with Si atoms and some N atoms are replaced with O atoms in the form of solid solution so that the periodic structure of AlN is changed slightly. Examples of the pseudopolymorph include the 27R phase ($SiAl_8O_2N_8$), the 21R phase ($SiAl_6O_2N_6$), the 12H phase ($SiAl_5O_2N_5$), and the 15R phase ($SiAl_4O_2N_4$), in order of decreasing AlN content. The first and second members for semiconductor manufacturing apparatus according to the present invention are not limited and may be any member that is to be included in a semiconductor manufacturing apparatus and joined to an aluminum nitride base member. Examples of such a member include a susceptor and a plate, such as a heater and an electrostatic chuck. The term "aluminum nitride base member" used herein refers to a member composed mainly of aluminum nitride (e.g., total amount of aluminum and nitrogen is 70% by mass or more of the mass of the entire member).

In the first and second members for semiconductor manufacturing apparatus according to the present invention, at least one element selected from silicon and oxygen is preferably dissolved in aluminum nitride included in the composite material. This reduces the thermal conductivity of aluminum nitride crystals and allows the proportion of the pseudopolymorph, which serves as a composite phase, to be reduced. Reducing the proportion of the pseudopolymorph advantageously limits the difference in thermal expansion coefficient between the composite material and aluminum nitride to be further small. Since the pseudopolymorph has slightly lower resistance to corrosion by halogen plasma than aluminum nitride, reducing the proportion of the pseudopolymorph also advantageously enhances the corrosion resistance of the member for a semiconductor manufacturing apparatus.

In the first and second members for semiconductor manufacturing apparatus according to the present invention, the mass ratio of Al, N, Si, and O included in the composite material is preferably Al:N:Si:O=59 to 63:29 to 34:1 to 5:2 to 8, with the total mass of Al, N, Si, and O being 100. Limiting the mass proportions of the above elements to fall within the ranges above enables the thermal conductivity of the member for a semiconductor manufacturing apparatus to be 50 W/mK or less with certainty. The mass ratio of Al, N, Si, and O included in the composite material is more preferably Al:N:Si:O=59.6 to 62.7:29.9 to 33.1:1.5 to 4.5: 2.7 to 7.1, with the total mass of Al, N, Si, and O being 100.

In the first and second members for semiconductor manufacturing apparatus according to the present invention, the composite material preferably includes at least one selected from an oxide of a rare-earth metal and an oxynitride of a rare-earth metal, the proportion of the mass of the rare-earth metal being more than 0 and 3.0 or less, with the total mass of elements other than the rare-earth metal being 100. In such a case, the constituent including the rare-earth metal promotes the sintering of the composite material. This enables a dense composite material to be prepared under normal pressure. There is no problem in performing sintering under pressure by hot pressing, HIP, or the like regardless of the presence of a rare-earth metal in order to prepare a dense composite material.

In the first and second members for semiconductor manufacturing apparatus according to the present invention, the composite material preferably has a thermal conductivity of 30 W/mK or less at 550° C. This is particularly advantageous for a member used at high temperatures, such as a member for heater.

In the first and second members for semiconductor manufacturing apparatus according to the present invention, the composite material preferably has a thermal expansion coefficient of 5.5 to 6.0 ppm/° C. at 40° C. to 1000° C. In such a case, the difference in thermal expansion coefficient between the composite material and aluminum nitride is small. This reduces the stress caused due to a thermal expansion coefficient mismatch between the member for a semiconductor manufacturing apparatus and the aluminum nitride base member to which the member for a semiconductor manufacturing apparatus is joined and enables the member for a semiconductor manufacturing apparatus and the aluminum nitride base member to be joined to each other in good condition. In particular, the likelihood of cracking and the like occurring in a member that is subjected to a repeated cycle of heating and cooling, such as a heater, can be reduced.

In the first and second members for semiconductor manufacturing apparatus according to the present invention, the composite material preferably has an open porosity of 0.5% or less. In such a case, the surface of the member can be smooth. In addition, the likelihood of a gas leaking from the composite material or from the vicinity of the joint between the member and another member joined to the member can be reduced. Furthermore, the likelihood of particles being generated due to, for example, contact of halogen gas plasma can be reduced.

In the first and second members for semiconductor manufacturing apparatus according to the present invention, the composite material preferably has a four-point bending strength of 250 MPa or more. In such a case, the member for a semiconductor manufacturing apparatus has a strength comparable to or higher than the strengths of ceramic members included in existing semiconductor manufacturing apparatuses and can be suitably used as a structural member.

A method for producing a member for a semiconductor manufacturing apparatus according to the present invention comprises mixing together aluminum nitride, alumina, and silicon nitride such that the mass proportions of aluminum nitride, alumina, and silicon nitride to the total mass of aluminum nitride, alumina, and silicon nitride are, by mass, 81% to 95%, 3% to 13%, and 2% to 9%, respectively, in order to prepare a mixed powder, forming the mixed powder into a compact, and firing the compact at 1750° C. to 1850° C. in order to produce any one of the above-described members for a semiconductor manufacturing apparatus.

By the above method, any one of the above-described members for semiconductor manufacturing apparatus can be produced in a relatively easy manner. For example, in the case where pressureless firing is employed, the mixed powder is formed into a shape by uniaxial pressing, isostatic pressing, extrusion molding, or casting. The resulting compact is fired at 1750° C. to 1850° C. under normal pressure in a firing furnace in an inert atmosphere (e.g., nitrogen or argon). In the case where hot-press firing is employed, the mixed powder is formed into a compact by uniaxial pressing or the like, and the compact is placed in a firing mold and fired by hot pressing in a vacuum atmosphere or an inert atmosphere at a pressure of 100 to 400 kgf/cm$^2$ at 1750° C. to 1850° C. In the case where the member for a semiconductor manufacturing apparatus has a complex shape, pressureless firing is preferably performed. The mixed powder is preferably prepared by mixing together aluminum nitride, alumina, and silicon nitride such that the mass proportions of aluminum nitride, alumina, and silicon nitride to the total mass of aluminum nitride, alumina, and silicon nitride are, by mass, 81.4% to 94.2%, 3.0% to 12.6%, and 2.8% to 8.2%, respectively.

In the method for producing a member for a semiconductor manufacturing apparatus according to the present invention, a rare-earth oxide may be added to the mixed powder, the rare-earth oxide serving as a sintering aid. Examples of the rare-earth oxide include $Y_2O_3$, $La_2O_3$, $CeO_2$, $Sm_2O_3$, $Eu_2O_3$, $Gd_2O_3$, $Dy_2O_3$, $Ho_2O_3Er_2O_3$, and $Yb_2O_3$. Among the above, rare-earth oxides, $Y_2O_3$ and $Yb_2O_3$ are preferable. Adding an excessively large amount of rare-earth oxide to the mixed powder increases the thermal expansion coefficient of the composite material. Accordingly, the amount of rare-earth oxide added to the mixed powder is preferably 3% by mass or less of the mass of the entire mixed powder.

A heater including a shaft according to the present invention comprises:
 a shaft that is any one of the above-described members for semiconductor manufacturing apparatus; and
 a wafer-supporting heater joined to the shaft, the wafer-supporting heater being composed of an aluminum nitride base material.

The above heater including a shaft enhances the thermal uniformity of the wafer-supporting heater to a sufficient degree. Moreover, the low thermal conductivity of the shaft allows the length of the shaft to be reduced. This leads to a reduction in the size of the heater including a shaft. The above heater including a shaft also has high corrosion resistance.

In the heater including a shaft according to the present invention, the difference in thermal expansion coefficient between the shaft and the wafer-supporting heater is preferably 0.3 ppm/° C. or less at 40° C. to 1000° C. In such a case, no thermal stress occurs at the joint or, even when a thermal stress occurs at the joint, it is negligibly small. This reduces the likelihood of cracking occurring under service conditions where a cycle of heating and cooling is repeated.

In the heater including a shaft according to the present invention, the shaft and the wafer-supporting heater are preferably joined to each other with a bonding layer interposed therebetween, the bonding layer including aluminum nitride, spinel, and a rare-earth oxyfluoride. Preferable examples of the rare-earth oxyfluoride include YOF, LaOF, CeOF, NdOF, TbOF, YbOF, and LuOF. YOF and YbOF are particularly preferable.

DETAILED DESCRIPTION OF THE INVENTION

Figure 1:
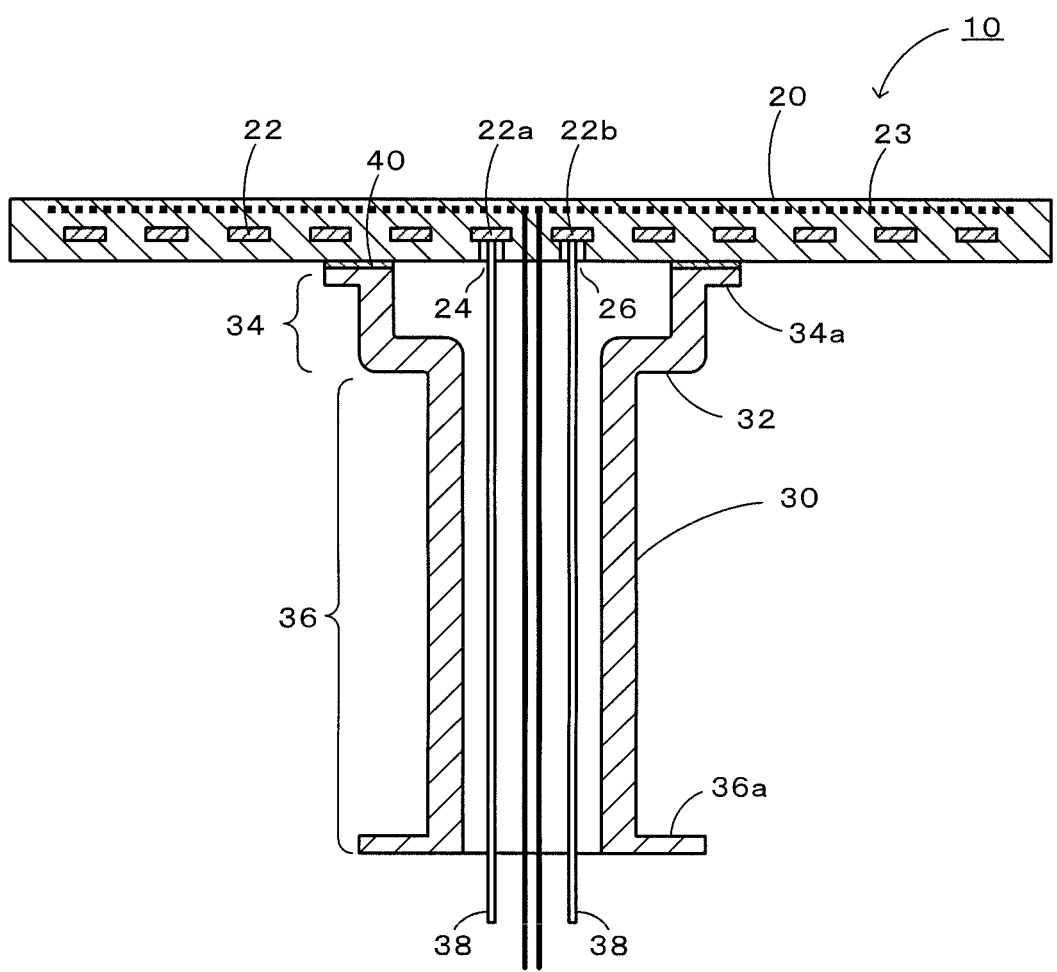
FIG. 1 is a cross-sectional view of a heater 10 including a shaft.
Figure 2:
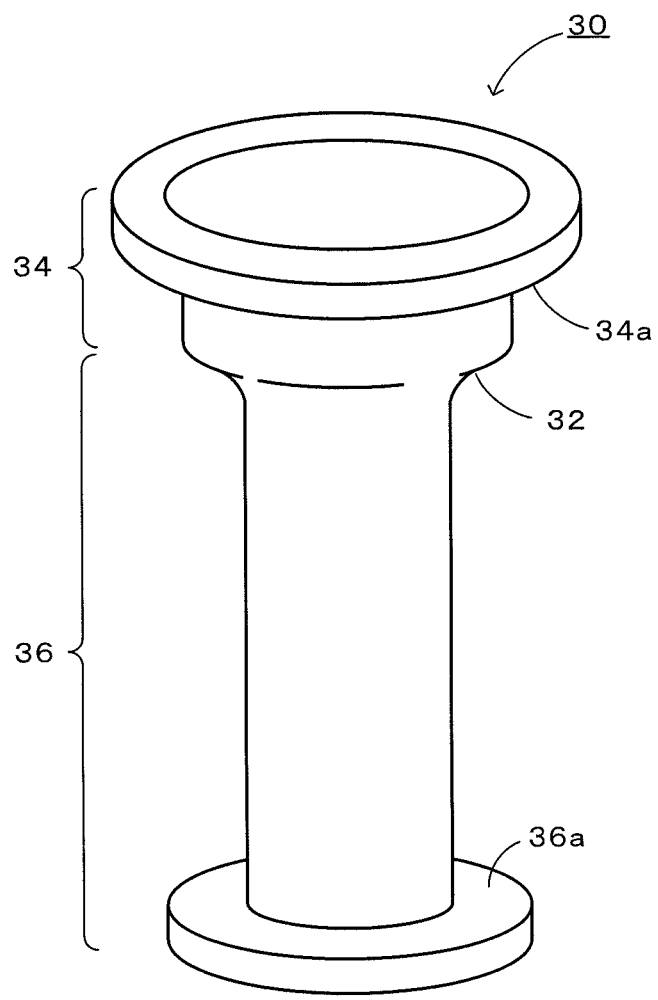
FIG. 2 is a perspective view of a tubular shaft 30.

A preferred embodiment of the present invention is described below. FIG. 1 is a cross-sectional view of a heater 10 including a shaft according to an embodiment. FIG. 2 is a perspective view of a tubular shaft 30.

The heater 10 including a shaft is used for heating wafers, which are subjected to a heat treatment such as a plasma CVD process. The heater 10 is disposed in a vacuum chamber that is not illustrated in the drawing. The heater 10 including a shaft is constituted by a wafer-supporting heater 20, on which a wafer can be placed and which includes a resistance heating element 22 buried therein, and a tubular shaft 30 joined to the rear surface of the wafer-supporting heater 20.

The wafer-supporting heater 20 is a disk-like member composed of aluminum nitride (aluminum nitride base member). An example of the wafer-supporting heater 20 is prepared by sintering a mixture of an aluminum nitride powder and yttria that serves as a sintering aid and has a thermal conductivity of 150 W/mK or more at room temperature and a thermal conductivity of 80 W/mK or more at 550° C. and a thermal expansion coefficient of 5.7 ppm/° C. The wafer-supporting heater 20 includes the resistance heating element 22 buried therein, which is a resistance heating element composed of molybdenum. First and second openings 24 and 26 are formed in the vicinity of the center of the rear surface of the wafer-supporting heater 20. The resistance heating element 22 extends from an end portion 22$a$ positioned approximately at the center of the wafer-supporting heater 20 to another end portion 22$b$ positioned approximately at the center of the wafer-supporting heater 20 while being buried in substantially the entire surface of the wafer-supporting heater 20 in the manner of a "one-stroke sketch". The end portion 22$a$ and the other end portion 22$b$ of the resistance heating element 22 are exposed to the outside through first and second openings 24 and 26, respectively, of the wafer-supporting heater 20. The wafer-supporting heater 20 also includes a plate electrode 23 buried therein, which serves as a high-frequency electrode.

The tubular shaft 30 is a member for a semiconductor manufacturing apparatus which is composed of a composite material including principal constituent phases that are aluminum nitride and a pseudopolymorph of aluminum nitride. The pseudopolymorph of aluminum nitride includes silicon, aluminum, oxygen, and nitrogen. The pseudopolymorph of aluminum nitride has at least one periodic structure selected from the 27R phase and the 21R phase or an X-ray diffraction peak at least at 2θ=59.8° to 60.8°. The composite material preferably has a thermal conductivity of 50 W/mK or less and more preferably 40 W/mK or less at room temperature. The composite material preferably has a thermal conductivity of 30 W/mK or less, more preferably 25 W/mK or less, and further preferably 20 W/mK or less at operating temperature (550° C.). At least one element selected from silicon and oxygen is preferably dissolved in aluminum nitride included in the composite material. The mass ratio of Al, N, Si, and O included in the composite material is preferably Al:N:Si:O=59 to 63:29 to 34:1 to 5:2 to 8 and is more preferably Al:N:Si:O=59.6 to 62.7:29.9 to 33.1:1.5 to 4.5:2.7 to 7.1. The composite material preferably has a thermal expansion coefficient (CTE) of 5.5 to 6.0 ppm/° C. at 40° C. to 1000° C. The composite material preferably has an open porosity of 0.5% or less. The composite material preferably has a four-point bending strength of 250 MPa or more. The composite material may include at least one selected from an oxide of a rare-earth metal and an oxynitride of a rare-earth metal. In such a case, the proportion of the mass of the rare-earth metal is preferably more than 0 and 3.0 or less, with the total mass of elements other than the rare-earth metal being 100. The difference in thermal expansion coefficient between the tubular shaft 30 and the wafer-supporting heater 10 is preferably 0.3 ppm/° C. or less at 40° C. to 1000° C.

The tubular shaft 30 has a step 32 formed thereon; a portion of the tubular shaft 30 which extends from the step 32 toward the wafer-supporting heater 20 serves as a large-diameter section 34, while the other portion of the tubular shaft 30 which extends from the step 32 toward a direction opposite to the wafer-supporting heater 20 serves as a small-diameter section 36. Flanges 34a and 36a are formed at the end portions of the large-diameter section 34 and the small-diameter section 36, respectively. The end portion of the large-diameter section 34 of the tubular shaft 30 is joined to the rear surface of the wafer-supporting heater 20. Feeding rods 38 and 38, which are joined to the end portion 22a and the other end portion 22b of the resistance heating element 22, respectively, are disposed in a space formed inside the tubular shaft 30 so as to extend in the axial direction. The resistance heating element 22 included in the wafer-supporting heater 20 is supplied with electric power through the feeding rods 38 and 38.

An example method for preparing the tubular shaft 30 is described below. In the example method described below, pressureless firing is employed since the tubular shaft 30 has a rather complex shape as illustrated in FIG. 2. First, aluminum nitride, alumina, and silicon nitride are mixed together such that the mass proportions of aluminum nitride, alumina, and silicon nitride to the total mass of aluminum nitride, alumina, and silicon nitride are, by mass, 81% to 95%, 3% to 13%, and 2% to 9%, respectively, in order to prepare a mixed powder. More preferably, 81.4% to 94.2% by mass of aluminium nitride, 3.0% to 12.6% by mass of alumina, and 2.8% to 8.2% by mass of silicon nitride are mixed together in order to prepare a mixed powder. The mixed powder is charged into a mold and formed into a tubular compact by cold isostatic pressing (CIP). The shaft compact is fired in a pressureless firing furnace at 1750° C. to 1850° C. Thus, a tubular shaft 30 is formed. To the mixed powder, a rare-earth oxide (e.g., $Y_2O_3$ and $Yb_2O_3$) may be added as a sintering aid. In such a case, the amount of rare-earth oxide added to the mixed powder is preferably 3% by mass or less of the mass of the entire mixed powder. The tubular shaft may optionally be worked into a desired shape.

The tubular shaft 30 is joined to the wafer-supporting heater 20 with a bonding layer 40 interposed therebetween. The wafer-supporting heater 20 and the tubular shaft 30 are joined to each other, for example, in the following manner. An aluminum nitride powder (particle diameter: 0.8 μm, oxygen content: 4.8 mass %) is used as an aluminum nitride raw material. Subsequently, 50% to 90% by mass of the aluminium nitride raw material and 10% to 50% by mass of commercially available magnesium fluoride (purity: 99.9% or more) are weighed such that the total content of the aluminium nitride raw material and magnesium fluoride is 100% by mass. The aluminium nitride raw material and magnesium fluoride are mixed with each other with an alumina mortar to form a bonding material composition. To the bonding material composition, a binder that is a 45-mass % terpineol solution of an acrylic resin is added such that the ratio of the amount of binder to the amount of bonding material composition is 30% by mass. The resulting mixture is stirred with an alumina mortar to form a bonding material paste. The bonding material paste is applied onto at least one of the bonding surfaces of the wafer-supporting heater 20 and the tubular shaft 30. The bonding material paste deposited on the bonding surface is dried, and the solvent included in the bonding material paste is volatilized. Thus, the bonding material composition is adhered onto the bonding surface. Subsequently, the bonding surfaces of the wafer-supporting heater 20 and the tubular shaft 30 are superimposed on each other and held at a bonding temperature (maximum temperature) of 1400° C. for 2 hours in a nitrogen gas. In this step, pressure is applied to the supporting heater 20 and the tubular shaft 30 in a direction perpendicular to the bonding surfaces such that the supporting heater 20 and the tubular shaft 30 are pressed against each other. Thus, the tubular shaft 30 is joined to the wafer-supporting heater 20 with the bonding layer 40 interposed therebetween in the above-described manner. The bonding layer 40 includes crystal phases such as AlN, $MgAl_2O_4$ (spinel), and YOF (rare-earth oxyfluoride). The O element included in $MgAl_2O_4$ and YOF is considered to originate from the O element included in the aluminum nitride raw material and $Y_2O_3$ used as a sintering aid. The Y element included in YOF is considered to originate from $Y_2O_3$ used as a sintering aid.

The amounts of heat that dissipate from tubular shafts 30 of the heater 10 including a shaft which have different thermal conductivities are determined by simulation. In the comparison below, a tubular shaft 30 having a thermal conductivity of 80 W/mK at room temperature and a thermal conductivity of 50 W/mK at the operating temperature (550° C.) is used as a reference. In the case where the tubular shaft 30 has a thermal conductivity of 40 W/mK at room temperature and a thermal conductivity of 30 W/mK at 550° C., the amount of heat that dissipates from the tubular shaft 30 is reduced to 70% of the reference. In the case where the tubular shaft 30 has a thermal conductivity of 40 W/mK at room temperature and a thermal conductivity of 25 W/mK at 550° C. that is the operating temperature, the amount of heat that dissipates from the tubular shaft 30 is reduced to 65% of the reference. In the case where the tubular shaft 30 has a thermal conductivity of 40 W/mK at room temperature and a thermal conductivity of 20 W/mK at 550° C. that is the operating temperature, the amount of heat that dissipates from the tubular shaft 30 is reduced to 60% of the reference. Since the amount of heat that dissipates from the tubular shaft 30 is small compared with the reference, the amount of heat that dissipates from a portion of the wafer-supporting heater 20 to which the tubular shaft 30 is joined and the likelihood of the portion acting as a cool spot can be reduced. As a result, the thermal uniformity of the wafer-supporting heater 20 is enhanced compared with the reference.

In the above-described embodiment, the tubular shaft 30 has a low thermal conductivity. This reduces the amount of heat that dissipates from the wafer-supporting heater 20, which is an aluminum nitride base member, into the tubular shaft 30. As a result, the thermal uniformity of the wafer-supporting heater 20 can be enhanced to a sufficient degree. In addition, the tubular shaft 30 has high corrosion resistance since it has a lower Si content than mullite used in PTL 1.

The present invention is not limited to the above-described embodiment, and can be carried out by various modes as long as they belong to the technical scope of the invention.

For example, although a tubular shaft 30 joined to a wafer-supporting heater 20 is taken an example of the member for a semiconductor manufacturing apparatus according to the the present invention in the above embodiment, the member for a semiconductor manufacturing apparatus is not limited to this and may be any member for a semiconductor manufacturing apparatus which is to be joined to an aluminum nitride base member.

Although the wafer-supporting heater 20 and the tubular shaft 30 are joined to each other with a bonding layer 40 interposed therebetween which includes AlN, spinel, and YOF in the above-described embodiment, the method for joining the wafer-supporting heater 20 and the tubular shaft 30 to each other is not limited to this. For joining the wafer-supporting heater 20 and the tubular shaft 30 to each other, for example, a brazing filler metal may be used. Alternatively, the wafer-supporting heater 20 and the tubular shaft 30 may be bonded directly to each other.

EXAMPLES

I. Experimental Examples 1 to 21

Experimental examples 5 to 20 correspond to Examples of the present invention, while Experimental examples 1 to 4 and 21 correspond to the comparative examples. The examples below do not limit the present invention.

1. Production Conditions (Raw Materials)

The AlN raw material used was a commercially available, high-purity fine powder (oxygen content: 0.9%, content of impurities excluding oxygen: 0.1% or less, average particle diameter: 1.1 μm). The $Al_2O_3$ raw material used was a commercially available, high-purity fine powder (purity: 99.99% or more, average particle diameter: 0.5 μm). The $Si_3N_4$ raw material used was a commercially available, high-purity fine powder (oxygen content: 1.3%, content of impurities excluding oxygen: 0.1% or less, average particle diameter: 0.6 μm). The $Y_2O_3$ raw material used was a commercially available, high-purity fine powder (purity: 99.9% or more, average particle diameter: 1 μm).

(Mixing)

The AlN raw material, the $Al_2O_3$ raw material, and the $Si_3N_4$ raw material (and $Y_2O_3$, as needed) were each weighed in the proportion of the raw material shown in Table 1 and mixed with one another by wet blending for 4 hours in a nylon pot with iron-core nylon balls having a diameter of 20 mm by using alcohol as a solvent. After the mixing, the resulting slurry was taken from the pot and dried at 110° C. under a stream of nitrogen. The residue was passed through a 30-mesh sieve. Thus, a mixed powder was prepared.

(Shaping)

The mixed powder was formed into a cylindrical compact having a diameter of 65 mm and a thickness of about 20 mm by uniaxial pressing at 100 kgf/cm². The compact was subjected to cold isostatic pressing at 2.5 ton/cm². The cylindrical compact was used as a material for evaluation of properties instead of a tubular shaft.

(Firing)

The compact was charged into a crucible (firing container) composed of BN and fired at the firing temperature (maximum temperature) shown in Table 1 for an amount of time at which the compact is to be held at the firing temperature which is shown in Table 1 in an atmosphere firing furnace including a carbon heater. In this step, a vacuum was maintained while the temperature was increased from the room temperature to 900° C.; nitrogen was introduced after the temperature had reached 900° C., and the compact was subsequently fired at the maximum temperature for the predetermined amount of time; the temperature was reduced to 1400° C.; and the firing was terminated. The pressure of nitrogen was set to a pressure of 1.5 atmospheres. The heating and cooling were performed at a rate of 100° C. to 300° C/hour.

TABLE 1

| | Production condition | | | | | | |
|---|---|---|---|---|---|---|---|
| | Proportion of mixed powder | | | | | Firing temperature (Maximum | |
| Experimental example | AlN mass % | $Al_2O_3$ mass % | $Si_3N_4$ mass % | $Y_2O_3$ mass % | total mass % | temperature) ° C. | Holding time Hr |
| 1 | 95.2 | 0.0 | 0.0 | 4.8 | 100 | 1800 | 4 |
|   | 100.0 | 0.0 | 0.0 | | | | |
| 2 | 94.3 | 0.0 | 2.8 | 2.9 | 100 | 1800 | 4 |
|   | 97.1 | 0.0 | 2.9 | | | | |
| 3 | 90.3 | 9.7 | 0.0 | 0.0 | 100 | 1800 | 4 |
|   | 90.3 | 9.7 | 0.0 | | | | |
| 4 | 94.3 | 1.2 | 1.6 | 2.9 | 100 | 1800 | 4 |
|   | 97.1 | 1.2 | 1.6 | | | | |
| 5 | 91.5 | 2.9 | 2.7 | 2.9 | 100 | 1800 | 4 |
|   | 94.2 | 3.0 | 2.8 | | | | |
| 6 | 90.0 | 5.9 | 4.1 | 0.0 | 100 | 1825 | 4 |
|   | 90.0 | 5.9 | 4.1 | | | | |
| 7 | 87.5 | 5.7 | 3.9 | 2.9 | 100 | 1800 | 4 |
|   | 90.0 | 5.9 | 4.0 | | | | |

TABLE 1-continued

| | Production condition | | | | | |
|---|---|---|---|---|---|---|
| | Proportion of mixed powder | | | | Firing temperature (Maximum | |
| Experimental example | AlN mass % | Al$_2$O$_3$ mass % | Si$_3$N$_4$ mass % | Y$_2$O$_3$ mass % | total mass % | temperature) ° C. | Holding time Hr |
| 8 | 87.5 | 5.7 | 3.9 | 2.9 | 100 | 1750 | 8 |
| | 90.0 | 5.9 | 4.0 | | | | |
| 9 | 88.2 | 5.8 | 4.0 | 2.0 | 100 | 1800 | 4 |
| | 90.0 | 5.9 | 4.1 | | | | |
| 10 | 86.2 | 5.6 | 8.2 | 0.0 | 100 | 1800 | 4 |
| | 86.2 | 5.6 | 8.2 | | | | |
| 11 | 86.3 | 5.7 | 5.1 | 2.9 | 100 | 1800 | 4 |
| | 88.9 | 5.9 | 5.3 | | | | |
| 12 | 87.1 | 5.7 | 5.2 | 2.0 | 100 | 1800 | 4 |
| | 88.9 | 5.8 | 5.3 | | | | |
| 13 | 85.2 | 7.4 | 4.5 | 2.9 | 100 | 1800 | 4 |
| | 87.7 | 7.6 | 4.6 | | | | |
| 14 | 84.2 | 9.1 | 3.8 | 2.9 | 100 | 1775 | 4 |
| | 86.7 | 9.4 | 3.9 | | | | |
| 15 | 83.2 | 9.0 | 4.9 | 2.9 | 100 | 1825 | 4 |
| | 85.7 | 9.3 | 5.0 | | | | |
| 16 | 81.4 | 12.5 | 6.1 | 0.0 | 100 | 1800 | 4 |
| | 81.4 | 12.5 | 6.1 | | | | |
| 17 | 81.4 | 12.5 | 6.1 | 0.0 | 100 | 1750 | 8 |
| | 81.4 | 12.5 | 6.1 | | | | |
| 18 | 79.0 | 12.2 | 5.9 | 2.9 | 100 | 1775 | 4 |
| | 81.4 | 12.6 | 6.1 | | | | |
| 19 | 79.0 | 12.2 | 5.9 | 2.9 | 100 | 1800 | 4 |
| | 81.4 | 12.6 | 6.1 | | | | |
| 20 | 79.8 | 12.3 | 5.9 | 2.0 | 100 | 1800 | 4 |
| | 81.4 | 12.6 | 6.0 | | | | |
| 21 | 61.9 | 25.7 | 12.4 | 0.0 | 100 | 1800 | 4 |
| | 61.9 | 25.7 | 12.4 | | | | |

*The upper value in each column refers to the proportion (mass %) of each compound to the total mass of AlN, Al2O3, Si3N4, and Y2O3. The lower value in each column refers to the proportion (mass %) of each compound to the total mass of AlN, Al2O3, and Si3N4.

2. Measurement of Basic Properties

Various types of specimens were prepared from the sintered compact prepared in each of Experimental examples, and the following basic properties of the sintered compact prepared in each of Experimental examples were measured. Tables 2 and 3 summarize the results.

(Open Porosity and Bulk Density)

Measurement of open porosity and bulk density was made by an Archimedes method in which pure water is used as a medium.

(Four-Point Bending Strength)

Measurement of four-point bending strength was made in accordance with JIS-R1601.

(Linear Thermal Expansion Coefficient)

The average linear thermal expansion coefficient (CTE) of each of the sintered compacts in the range of 40° C. to 1000° C. was calculated from a thermal expansion curve of the sintered compact, which was determined with a thermal mechanical analyzer TMA8310 produced by Rigaku Corporation by heating the sintered compact to 1000° C. at a rate of temperature rise of 20° C./min in an argon atmosphere. The reference sample used was alumina. In Tables 2 and 3, ΔCTE refers to the difference in CTE between the sintered compact prepared in each of Experimental examples and an aluminum nitride base member (in Examples, the sintered compact prepared in Experimental example 1).

(Thermal Conductivity (TC))

Calculation of thermal conductivity was done using the following expression: Thermal Conductivity (TC)=Specific Heat×Diffusivity of Heat×Bulk Density, where specific heat was determined by differential scanning calorimetry (DSC) and the diffusivity of heat was determined by a laser flash method. The calculation of TC was done at both room temperature and 550° C.

(Identification of Constituent Phases)

The composite material was pulverized with a mortar and mixed with an internal standard (Si). The resulting powder was subjected to an X-ray diffraction system in order to perform the identification of crystal phases. The measurement was made under the conditions of CuKα, 40 kV, 40 mA, and 2θ=5° to 70°. A sealed type X-ray diffraction system (D8 ADVANCE produced by Bruker AXS K. K.) was used.

(Proportions of Constituent Elements)

Al and Y: The sintered compact was pulverized, melted, decomposed with an acid, and formed into a solution. The proportions of Al and Y in the solution were determined by chelatometry or high-frequency inductively coupled plasma-atomic emission spectroscopy.

Si: The sintered compact was pulverized. The proportion of Si in the pulverized sintered compact was determined by gravimetry (conforming to JISR1616). In the case where the content of Si was low, the measurement was made by high-frequency inductively coupled plasma-atomic emission spectroscopy similarly to Al and Y.

N: The sintered compact was roughly pulverized. The content of N in the pulverized sintered compact was determined by an inert gas fusion-thermal conductivity method.

0: The sintered compact was roughly pulverized. The content of O in the pulverized sintered compact was determined by an inert gas fusion-nondispersive infrared absorption method.

TABLE 2

Basic property of sintered compact

| Experimental example | Open porosity % | Bulk density g/cm³ | Four-point bending strength Mpa | CTE ppm/°C. | Δ CTE ppm/°C. | TC (RT) W/mK | TC (550° C.) W/mK | Constituent phase | Proportion of constituent element* | | | | | |
|---|---|---|---|---|---|---|---|---|---|---|---|---|---|---|
| | | | | | | | | | Al mass % | Si mass % | N mass % | O mass % | Y mass % | total mass % |
| 1 | 0.0 | 3.33 | 401 | 5.7 | 0.0 | 180 | 85 | AlN, YAM, YAL | 62.4 | 0.0 | 32.5 | 1.8 | 3.3 | 100.0 |
| | | | | | | | | | 64.5 | 0.0 | 33.6 | 1.9 | 3.4 | 103.4 |
| 2 | 0.0 | 3.29 | 433 | 5.7 | 0.0 | 71 | 50 | AlN, Y$_2$Si$_3$O$_3$N$_4$, 27R | 61.8 | 1.5 | 33.2 | 1.4 | 2.0 | 100.0 |
| | | | | | | | | | 63.1 | 1.6 | 33.9 | 1.5 | 2.0 | 102.0 |
| 3 | 0.0 | 3.27 | 359 | 5.6 | 0.1 | 89 | 46 | AlN, Al$_5$O$_6$N | 64.2 | 0.0 | 30.7 | 5.2 | 0.0 | 100.0 |
| | | | | | | | | | 64.2 | 0.0 | 30.7 | 5.2 | 0.0 | 100.0 |
| 4 | 0.0 | 3.29 | 381 | 5.7 | 0.0 | 85 | 51 | AlN, 27R, YAG | 62.3 | 0.9 | 32.8 | 1.9 | 2.0 | 100.0 |
| | | | | | | | | | 63.6 | 0.9 | 33.5 | 2.0 | 2.1 | 102.1 |
| 5 | 0.0 | 3.30 | 265 | 5.7 | 0.0 | 46 | 30 | AlN, 27R, YAG | 61.5 | 1.5 | 32.4 | 2.7 | 2.0 | 100.0 |
| | | | | | | | | | 62.7 | 1.5 | 33.1 | 2.7 | 2.0 | 102.0 |
| 6 | 0.0 | 3.12 | 423 | 5.6 | 0.1 | 29 | 23 | AlN, 27R, 21R | 62.2 | 2.2 | 32.2 | 3.4 | 0.0 | 100.0 |
| | | | | | | | | | 62.2 | 2.2 | 32.2 | 3.4 | 0.0 | 100.0 |
| 7 | 0.0 | 3.31 | 302 | 5.7 | 0.0 | 24 | 21 | AlN, 27R, YAG | 60.7 | 2.1 | 31.6 | 3.7 | 1.8 | 100.0 |
| | | | | | | | | | 61.9 | 2.2 | 32.1 | 3.8 | 1.9 | 101.9 |
| 8 | 0.0 | 3.28 | 320 | 5.7 | 0.0 | 27 | 21 | AlN, 27R, YAG | 60.3 | 2.2 | 31.4 | 4.1 | 2.1 | 100.0 |
| | | | | | | | | | 61.6 | 2.2 | 32.1 | 4.1 | 2.1 | 102.1 |
| 9 | 0.0 | 3.23 | 341 | 5.5 | 0.2 | 23 | 18 | AlN, 27R, YAG | 60.9 | 2.2 | 31.7 | 3.8 | 1.3 | 100.0 |
| | | | | | | | | | 61.8 | 2.2 | 32.2 | 3.8 | 1.4 | 101.4 |
| 10 | 0.0 | 2.98 | 254 | 5.6 | 0.1 | 25 | 15 | AlN, 27R, 21R | 59.6 | 4.5 | 32.6 | 3.3 | 0.0 | 100.0 |
| | | | | | | | | | 59.6 | 4.5 | 32.6 | 3.3 | 0.0 | 100.0 |

*The upper value in each column refers to the proportion (mass %) of each element to the total mass of Al, Si, N, O, and Y. The lower value in each column refers to the proportion (mass %) of each element to the total mass of Al, Si, N, and O.

TABLE 3

Basic property of sintered compact

| Experimental example | Open porosity % | Bulk density g/cm³ | Four-point bending strength Mpa | CTE ppm/°C. | Δ CTE ppm/°C. | TC (RT) W/mK | TC (550° C.) W/mK | Constituent phase | Proportion of constituent element* | | | | | |
|---|---|---|---|---|---|---|---|---|---|---|---|---|---|---|
| | | | | | | | | | Al mass % | Si mass % | N mass % | O mass % | Y mass % | total mass % |
| 11 | 0.0 | 3.25 | 321 | 5.7 | 0.0 | 23 | 18 | AlN, 27R, 21R, YAG | 59.6 | 2.9 | 31.6 | 4.0 | 2.0 | 100.0 |
| | | | | | | | | | 60.8 | 2.9 | 32.2 | 4.1 | 2.1 | 102.1 |
| 12 | 0.0 | 3.17 | 342 | 5.6 | 0.1 | 19 | 14 | AlN, 27R, 21R, YAG | 60.3 | 2.8 | 31.9 | 3.7 | 1.3 | 100.0 |
| | | | | | | | | | 61.1 | 2.9 | 32.3 | 3.7 | 1.3 | 101.3 |
| 13 | 0.0 | 3.24 | 312 | 5.7 | 0.0 | 20 | 16 | AlN, 27R, 21R, YAG | 60.0 | 2.5 | 31.0 | 4.6 | 2.0 | 100.0 |
| | | | | | | | | | 61.2 | 2.5 | 31.6 | 4.7 | 2.0 | 102.0 |
| 14 | 0.0 | 3.21 | 347 | 5.8 | 0.1 | 21 | 17 | AlN, 27R, 21R, YAG | 60.0 | 2.1 | 30.3 | 5.6 | 2.1 | 100.0 |
| | | | | | | | | | 61.3 | 2.1 | 30.9 | 5.7 | 2.1 | 102.1 |
| 15 | 0.0 | 3.15 | 356 | 5.8 | 0.1 | 16 | 14 | AlN, 27R, 21R, YAG | 59.8 | 2.7 | 30.6 | 5.1 | 1.8 | 100.0 |
| | | | | | | | | | 60.9 | 2.7 | 31.1 | 5.2 | 1.8 | 101.8 |
| 16 | 0.0 | 3.17 | 427 | 5.7 | 0.0 | 13 | 13 | AlN, 27R, 21R | 60.0 | 3.3 | 30.3 | 6.4 | 0.0 | 100.0 |
| | | | | | | | | | 60.0 | 3.3 | 30.3 | 6.4 | 0.0 | 100.0 |
| 17 | 0.0 | 3.17 | 460 | 5.7 | 0.0 | 10 | 12 | AlN, 27R, 21R | 60.0 | 3.4 | 30.1 | 6.5 | 0.0 | 100.0 |
| | | | | | | | | | 60.0 | 3.4 | 30.1 | 6.5 | 0.0 | 100.0 |
| 18 | 0.0 | 2.84 | 286 | 6.0 | 0.3 | 11 | 12 | 21R, 27R, AlN, YAG | 58.4 | 3.3 | 29.3 | 7.0 | 2.0 | 100.0 |
| | | | | | | | | | 59.6 | 3.3 | 29.9 | 7.1 | 2.1 | 102.1 |
| 19 | 0.0 | 3.03 | 284 | 5.8 | 0.1 | 12 | 11 | 21R, 27R, AlN, YAG | 58.7 | 3.2 | 29.5 | 6.7 | 1.9 | 100.0 |
| | | | | | | | | | 59.8 | 3.3 | 30.1 | 6.8 | 2.0 | 102.0 |
| 20 | 0.0 | 2.81 | 299 | 5.9 | 0.2 | 10 | 10 | 21R, 27R, AlN, YAG | 59.2 | 3.2 | 29.8 | 6.4 | 1.3 | 100.0 |
| | | | | | | | | | 60.0 | 3.3 | 30.2 | 6.5 | 1.3 | 101.3 |
| 21 | 0.0 | 3.30 | 360 | 6.1 | 0.4 | 4 | 3 | 21R, 12H | 54.7 | 6.8 | 26.3 | 12.2 | 0.0 | 100.0 |
| | | | | | | | | | 54.7 | 6.8 | 26.3 | 12.2 | 0.0 | 100.0 |

*The upper value in each column refers to the proportion (mass %) of each element to the total mass of Al, Si, N, O, and Y. The lower value in each column refers to the proportion (mass %) of each element to the total mass of Al, Si, N, and O.

3. Evaluations

Experimental Example 1

Figure 3:
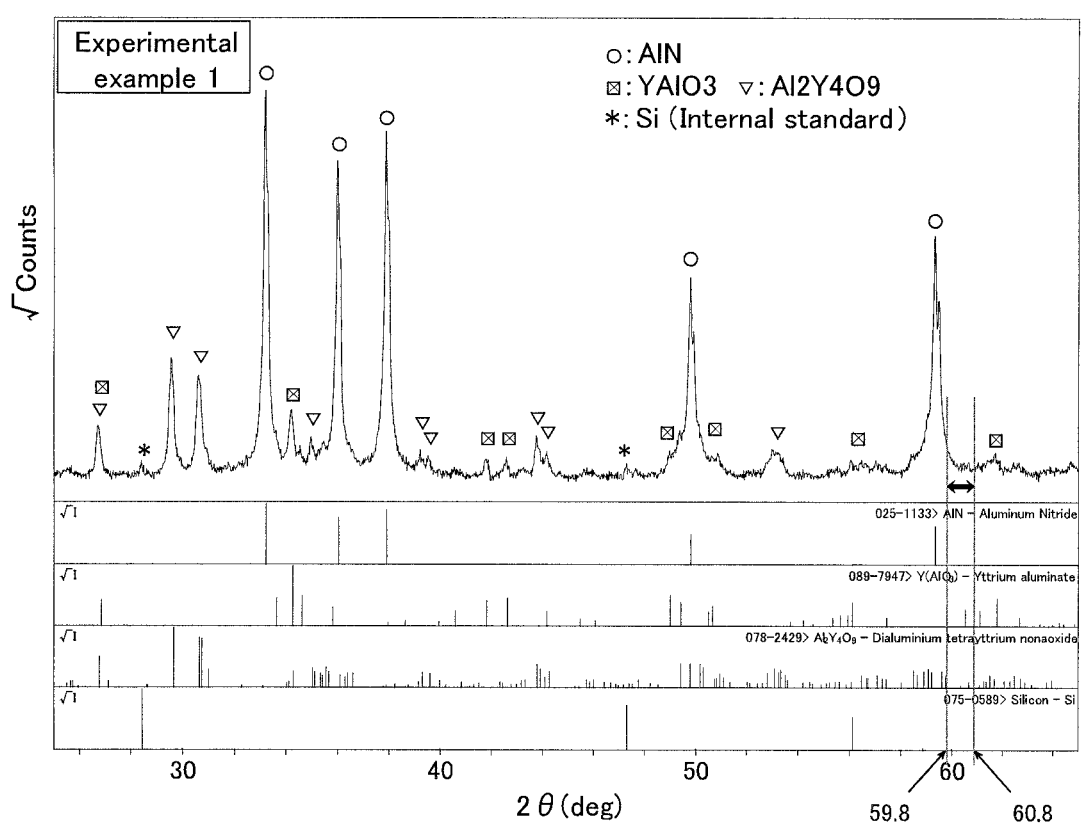
FIG. 3 is a graph illustrating an XRD profile of a sintered compact material prepared in Experimental example 1.

The sintered compact material prepared in Experimental example 1, which was prepared by firing a mixture of AlN with Y$_2$O$_3$ used as a sintering aid, included AlN, Al$_2$Y$_4$O$_9$ (YAM), and YAlO$_3$ (YAL). Since the mixed powder did not include Al$_2$O$_3$ and Si$_3$N$_4$, the pseudopolymorph was not formed and the amounts of Si and O dissolved in AlN were small. This increased the thermal conductivity of the sintered compact material. FIG. 3 illustrates an XRD profile of the sintered compact material prepared in Experimental example 1. The position denoted by * in FIG. 3 corresponds to Si added to the sintered compact as an internal standard for XRD measurement.

Experimental Example 2

Figure 4:
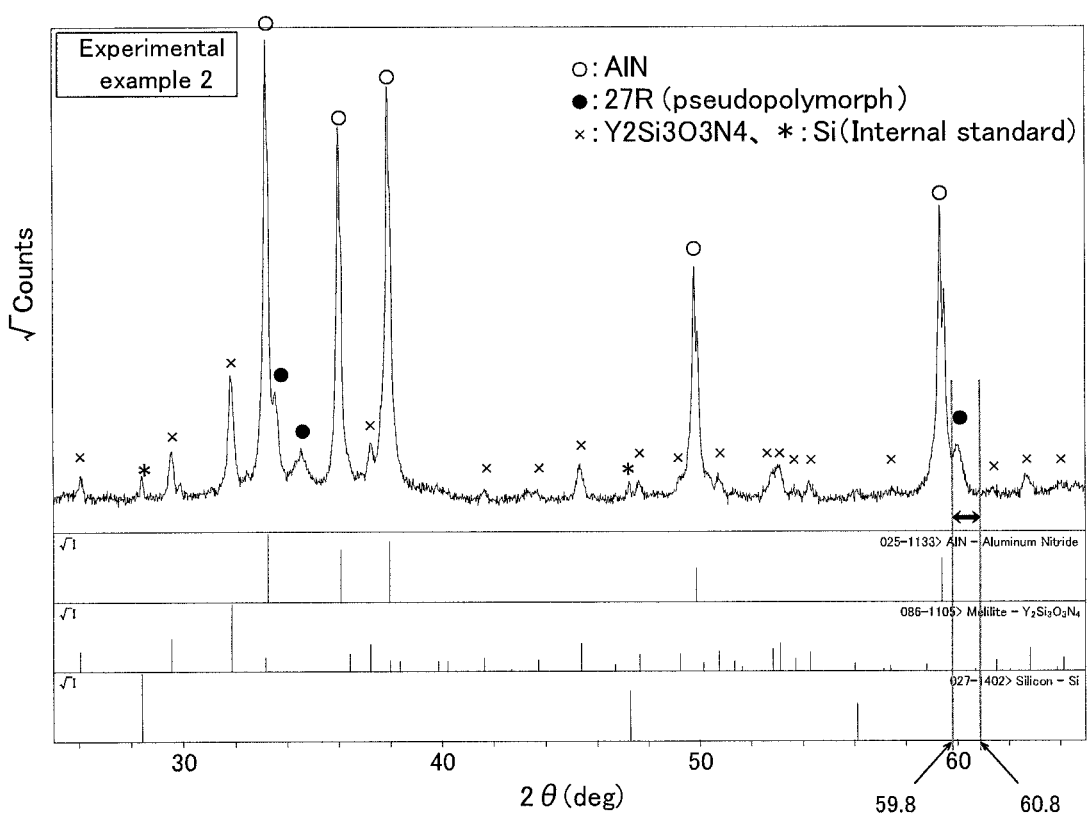
FIG. 4 is a graph illustrating an XRD profile of a sintered compact material prepared in Experimental example 2.

The sintered compact material prepared in Experimental example 2, which was prepared by firing a mixture of AlN, $Si_3N_4$, and $Y_2O_3$, included AlN, $Y_2Si_3O_3N_4$, and a trace amount of pseudopolymorph that was the 27R phase. However, a sufficient amount of pseudopolymorph was not formed since the mixed powder did not include $Al_2O_3$. Furthermore, dissolution of Si and O in AlN was confirmed but at a slight level. This resulted in failure to reduce the thermal conductivity of the sintered compact material to a sufficient degree. FIG. 4 illustrates an XRD profile of the sintered compact material prepared in Experimental example 2.

Experimental Example 3

Figure 5:
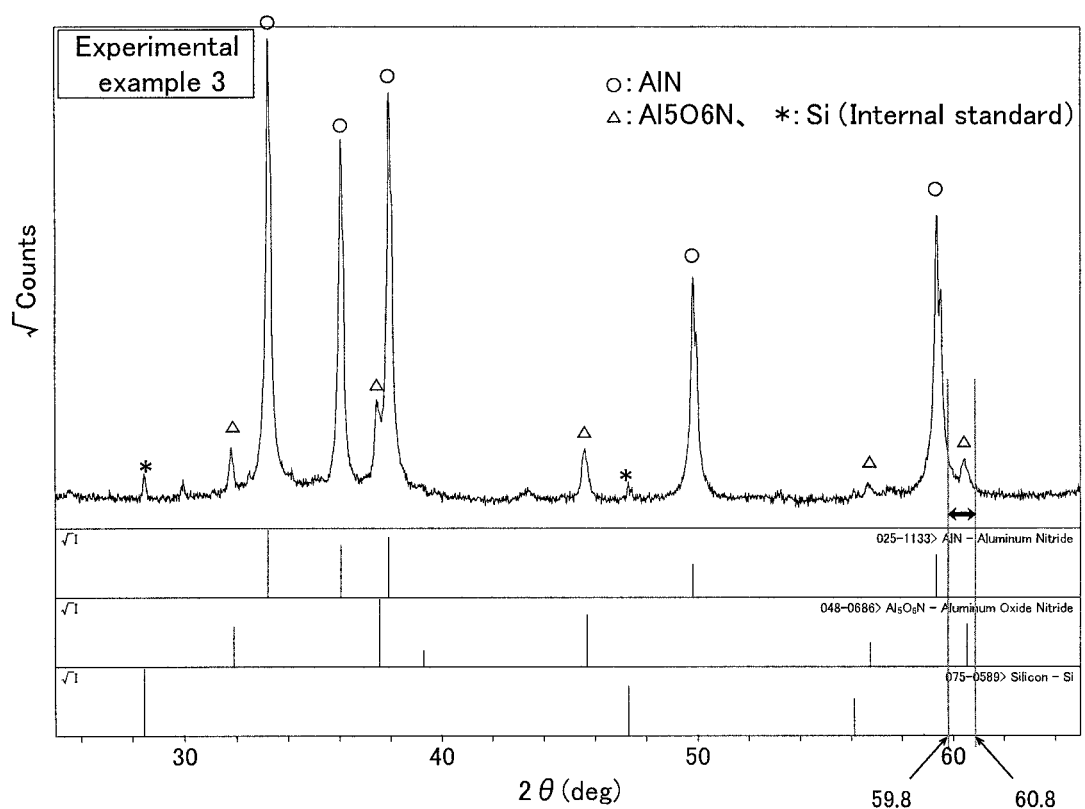
FIG. 5 is a graph illustrating an XRD profile of a sintered compact material prepared in Experimental example 3.

The sintered compact material prepared in Experimental example 3, which was prepared by firing a mixture of AlN and $Al_2O_3$, included AlN and $Al_5O_6N$. This material was prepared by hot pressing (20 MPa) because the mixed powder, to which $Y_2O_3$ was not added, had low sinterability. This material did not include the pseudopolymorph since an $Si_3N_4$ constituent was not used. Furthermore, the amounts of Si and O dissolved in AlN were small. This resulted in failure to reduce the thermal conductivity of the sintered compact material to a sufficient degree. FIG. 5 illustrates an XRD profile of the sintered compact prepared in Experimental example 3.

Experimental Example 4

The sintered compact material prepared in Experimental example 4, which was prepared by firing a mixture of AlN, $Al_2O_3$, $Si_3N_4$, and $Y_2O_3$, included AlN, $Al_5Y_3O_{12}$ (YAG), and the 27R phase. Since the proportions (mass %) of $Si_3N_4$ and $Al_2O_3$ in the mixed powder were low, a sufficient amount of pseudopolymorph was not formed. Moreover, the amounts of Si and O dissolved in AlN were insufficient. It is considered that this resulted in failure to reduce the thermal conductivity of the sintered compact material to a sufficient degree.

Experimental Examples 5 to 20

The sintered compact materials prepared in Experimental examples 5 to 20 each included AlN and at least one pseudopolymorph selected from the 27R phase and the 21R phase as constituent phases. In other words, the sintered compact materials prepared in Experimental examples 5 to 20 each had at least one periodic structure selected from the 27R phase and the 21R phase. Moreover, an X-ray diffraction peak was confirmed at 2θ=59.8° to 60.8°. The sintered compact materials prepared in Experimental examples 5, 7 to 9, 11 to 15, and 18 to 20, where $Y_2O_3$ was added to the raw material, each included the YAG as a constituent phase. The sintered compact materials prepared in Experimental examples 6, 10, 16, and 17, where $Y_2O_3$ was not added to the raw material, were materials sintered by hot pressing (20 MPa). In Experimental examples 5 to 20, the mass ratio of AlN, $Al_2O_3$, and $Si_3N_4$ included in the mixed powder fell within an appropriate range, and the mass ratio of Al, Si, N, and O included in the sintered compact material also fell in an appropriate range. As a result, an appropriate amount of pseudopolymorph was formed, and appropriate amounts of Si and O were dissolved in AlN. It is considered that this reduced the thermal conductivity of the sintered compact material to a sufficient degree. Furthermore, the sintered compact materials prepared in Experimental examples 5 to 20 each had high resistance to corrosion by a halogen gas and the like since they included a lower content of Si than mullite used in PTL 1.

Figure 6:
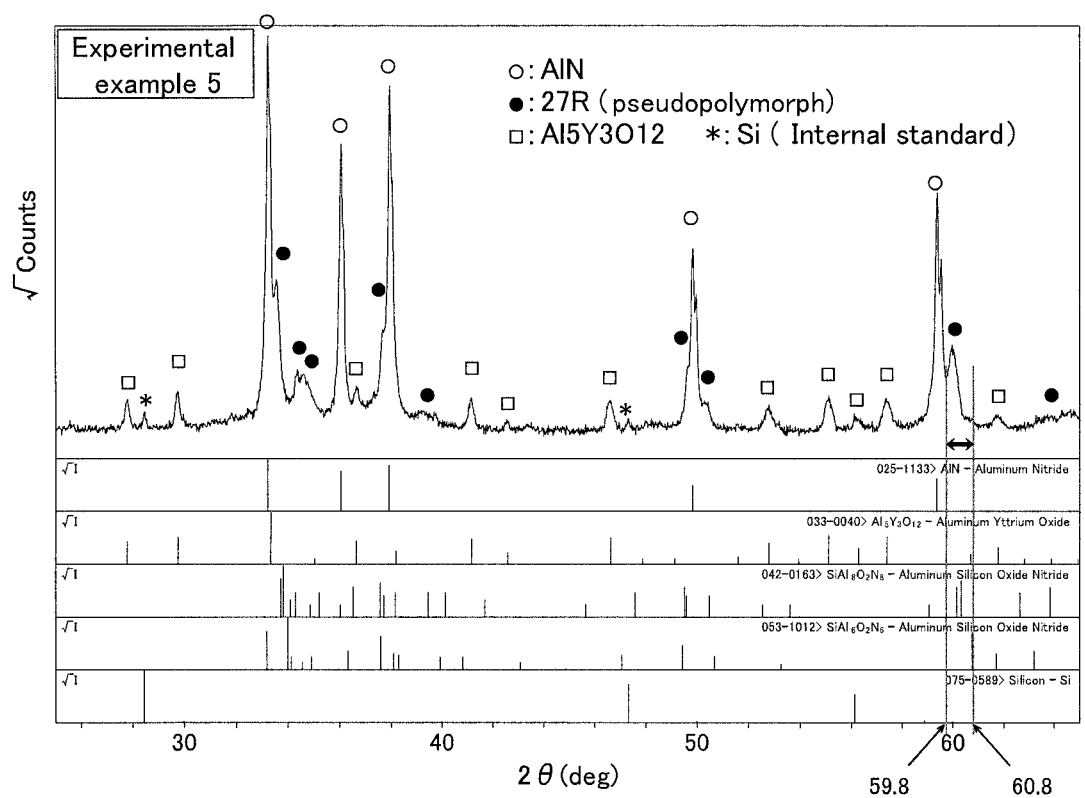
FIG. 6 is a graph illustrating an XRD profile of a sintered compact material prepared in Experimental example 5.
Figure 7:
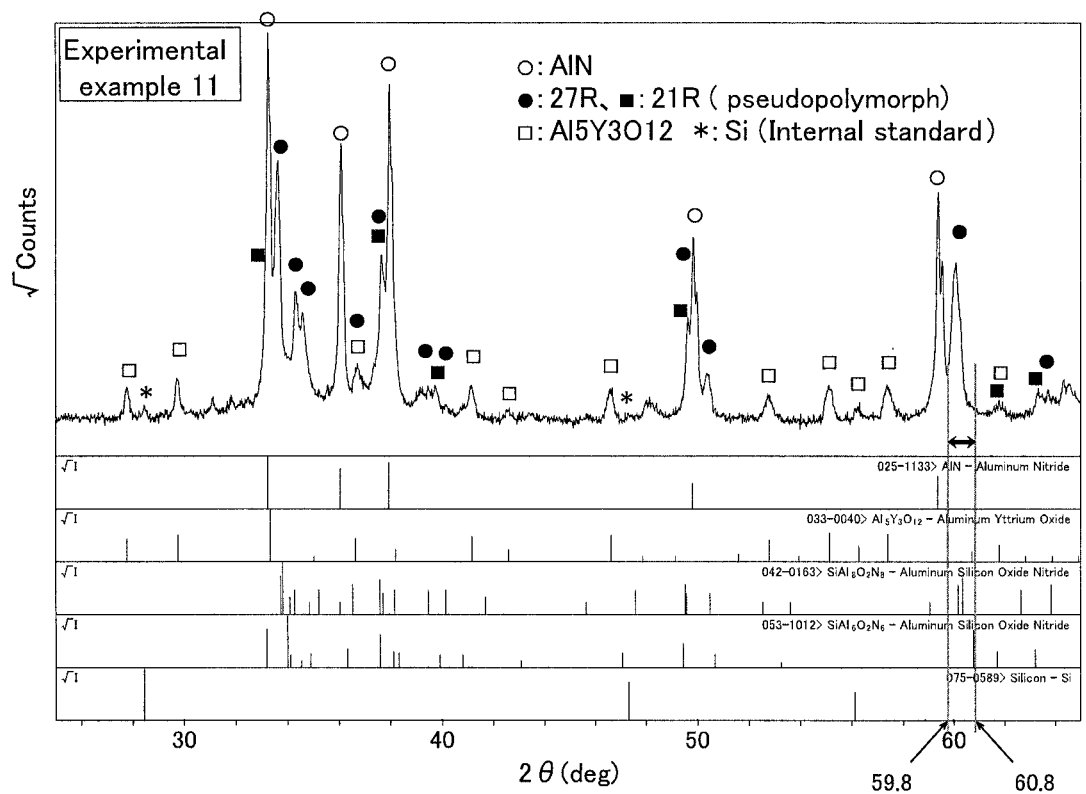
FIG. 7 is a graph illustrating an XRD profile of a sintered compact material prepared in Experimental example 11.
Figure 8:
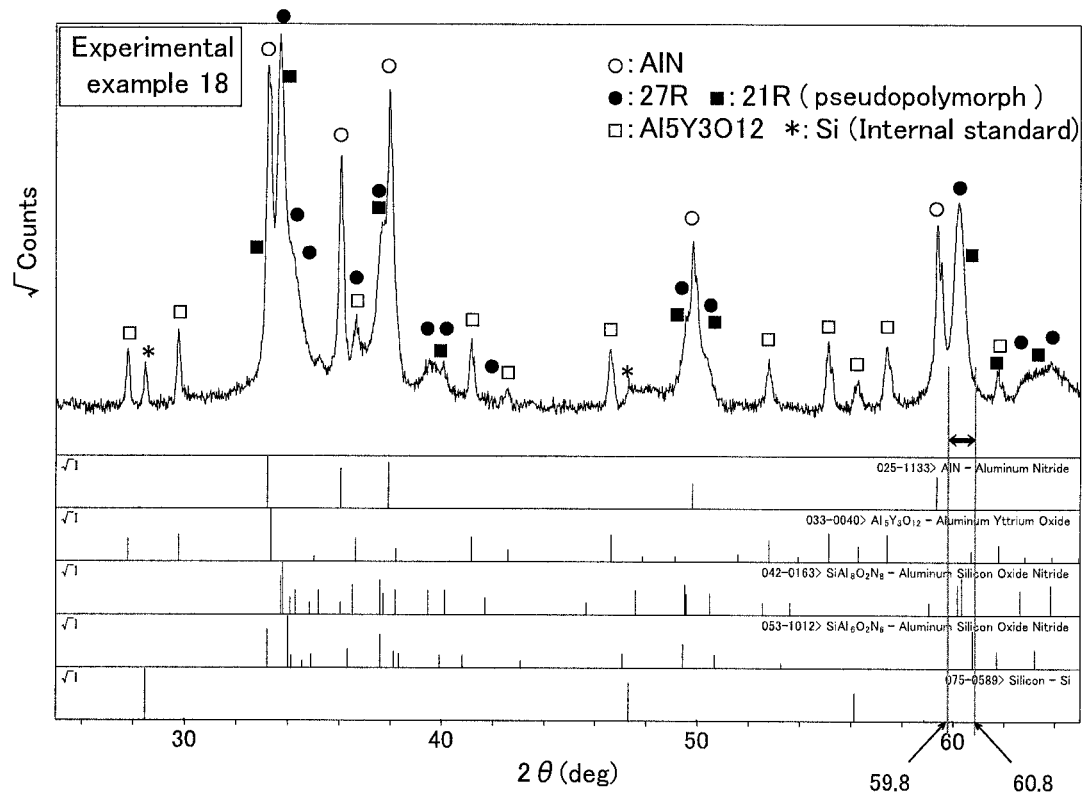
FIG. 8 is a graph illustrating an XRD profile of a sintered compact material prepared in Experimental example 18.

For example, FIGS. 6 to 8 illustrate XRD profiles of the sintered compact materials prepared in Experimental examples 5, 11, and 18, respectively. The XRD profiles illustrated in FIGS. 6 to 8 confirm that the sintered compact materials prepared in Experimental examples 5, 11, and 18 each included AlN, the 27R phase, and the YAG as constituent phases. In FIGS. 7 and 8, the sintered compact material also included the 21R phase. In addition, an X-ray diffraction peak was confirmed at 2θ=59.8° to 60.8°. The proportion (mass %) of AlN in the mixed powder decreased and the proportions (mass %) of $Al_2O_3$ and $Si_3N_4$ increased in the order of Experimental examples 5, 11, and 18. Accordingly, the proportions (mass %) of O and Si in the sintered compact material increased in this order. The XRD profiles of the sintered compact materials confirm that the peak intensities corresponding to AlN and the pseudopolymorph varied with the proportion (mass %) of AlN in the mixed powder and the proportions (mass %) of O and Si in the sintered compact material. That is, it is considered on the basis of the relationship between the peak intensities of the XRD profiles that the principal phase of the material prepared in Experimental example 5 was AlN, that the proportion of the pseudopolymorph in the material prepared in Experimental example 11 was increased, and that the principal phase of the material prepared in Experimental example 18 was the pseudopolymorph rather than AlN. Since a material including higher proportions of the constituent elements Si and O had a lower thermal conductivity, it is considered that a material including a higher content of the pseudopolymorph phase and larger amounts of Si and O dissolved in AlN has a lower thermal conductivity. The thermal expansion coefficients of the materials prepared in Experimental examples 5 to 20 were each controlled to be 5.5 to 6.0 ppm/° C. The difference between the thermal expansion coefficients of the materials prepared in Experimental examples 5 to 20 and the thermal expansion coefficient (5.7 ppm/° C.) of a high-thermal conducting aluminum nitride material as prepared in Experimental example 1 was considerably small, that is, 0.3 ppm/° C. or less. The materials prepared in Experimental examples 5 to 20 each had a bending strength of 250 MPa or more. Thus, the materials prepared in Experimental examples 5 to 20 had properties good enough to serve as a member for a semiconductor manufacturing apparatus. In other words, the materials prepared in Experimental examples 5 to 20 were low-thermal conducting materials having a sufficiently high strength, the thermal expansion coefficients of the materials being capable of being readily matched to that of a high-thermal conducting aluminum nitride material.

Figure 9:
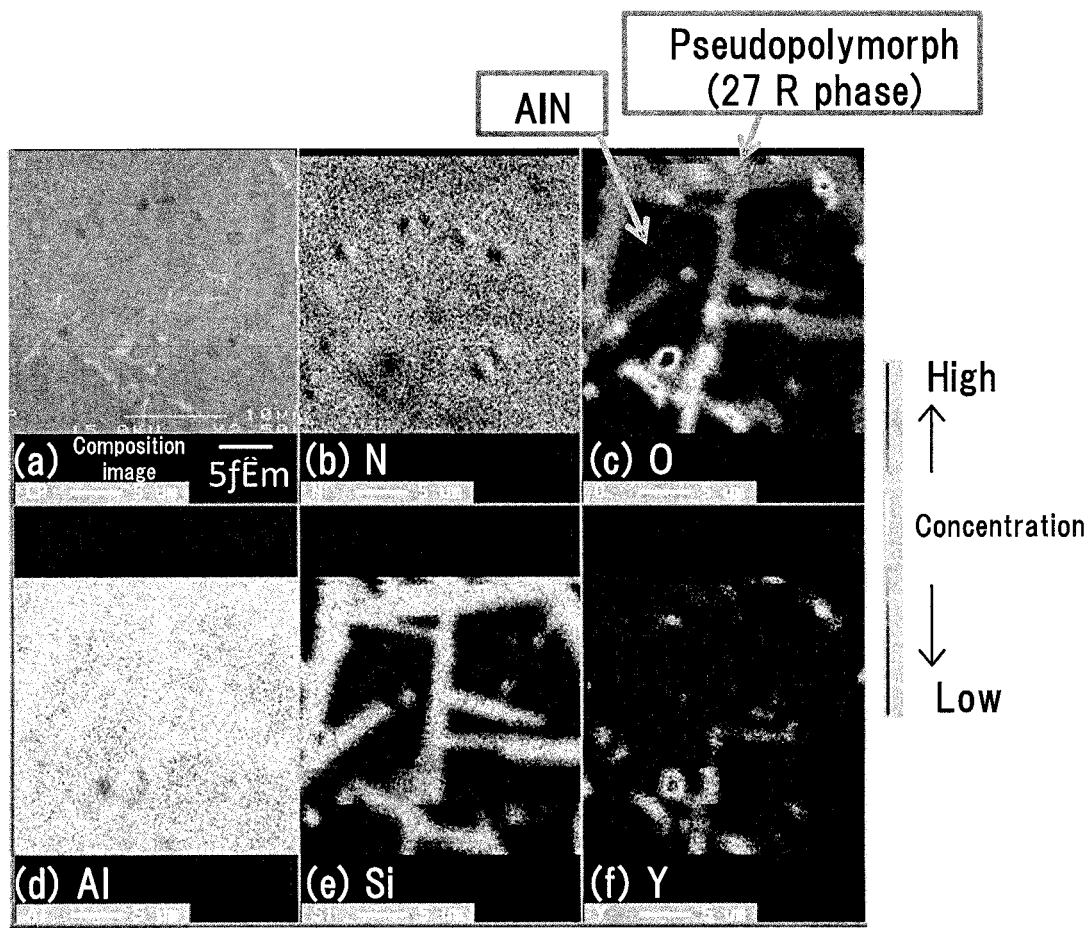
FIG. 9 includes EPMA images of a sintered compact material prepared in Experimental example 7.

FIG. 9 includes EPMA images of the sintered compact material prepared in Experimental example 7. In FIG. 9, although the color scale representing concentration is drawn in black and white for the sake of simplicity, in the actual EPMA images, the highest-concentration portions are colored in red, and the other portions of each image are color-coded in orange, yellow, yellow-green, light blue, blue, and deep blue in order of decreasing concentration, with the lowest-concentration portions being colored in black. FIG. 9(a) illustrates the overall element distribution. FIG. 9(b) illustrates the distribution of N. Light and dark gray pixels are scattered over the entire image as in stippling; in the actual image, blue and yellow-green pixels are scattered over the entire image. FIG. 9(c) illustrates the distribution of O. AlN is present in the darkly colored portions, which are deep blue or black in the actual image. A pseudopolymorph (27R phase) is present in the slightly light gray, columnar portions, which are light blue in the actual image. The relatively light gray parts of the columnar portions, which are yellow-green or yellow in the actual image, include red dots scattered therein, at which the YAG is present. FIG. 9(d) illustrates the distribution of Al. Although the entire image is colored in light gray, yellow-green, yellow, and red portions are scattered over the entirety of the actual image. This confirms that Al is present over the entire material. The red portions include AlN. FIG. 9(e) illustrates the distribution of Si. The darkly colored portions, which are deep blue or black in the actual image, are portions in which the content of Si is low.

The light gray, columnar portions, which are yellow-green or yellow in the actual image, are portions in which a pseudopolymorph (27R phase) is present. FIG. 9(f) illustrates the distribution of Y. The darkly colored portions are deep blue or black in the actual image. The light gray, dot-like portions, which are yellow-green (partly red) in the actual image, are portions in which YAG is present. The dark gray portions coincide with the portions of the AlN matrices in which the columnar pseudopolymorph, that is, the 27R phase, is formed. This indicates that part of Y is dissolved in the 27R phase as well as in YAG.

Figure 10:
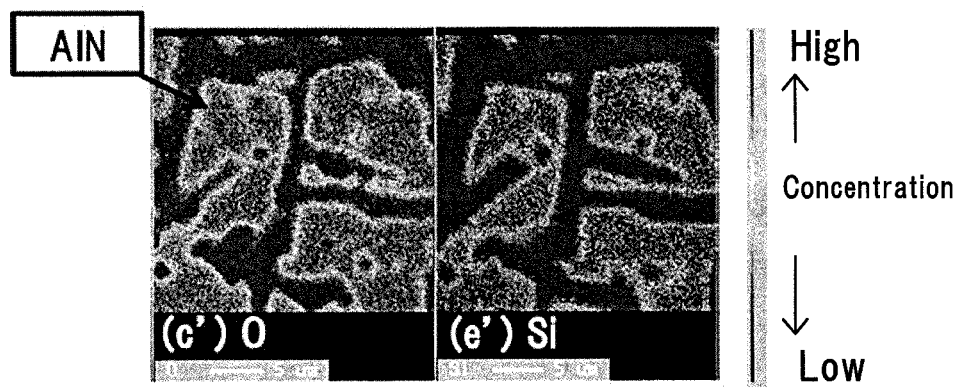
FIG. 10 includes EPMA images of a sintered compact material prepared in Experimental example 7.

It is not possible to determine from FIGS. 9(c) and 9(e) with certainty whether or not O and Si were dissolved in the AlN matrices. Accordingly, the concentration range represented by the color scale is changed so as to represent the low-concentration range as illustrated in FIGS. 10(c') and 10(e'). In FIG. 10(c'), the AlN matrices are colored in light gray, which are blue, yellow-green, or yellow in the actual image. This confirms the presence of O. In FIG. 10(e'), the AlN matrices are colored in light gray, which are blue, yellow-green, or yellow in the actual image. This confirms the presence of Si. The above images confirm that O and Si were dissolved in AlN included in the sintered compact material prepared in Experimental example 7. It is considered that the thermal conductivity of the AlN portions was reduced by O and Si dissolved in the AlN portions. It is considered that this reduced the thermal conductivity of the sintered compact material prepared in Experimental example 7 together with the incorporation of the low-thermal conducting intergranular phase, such as the 27R phase. Reducing the thermal conductivity of the AlN portions is particularly important for maintaining the thermal expansion coefficient of the material to be substantially equal to that of AlN. Thus, the dissolution of O and Si in the AlN portions enables the amount of low-thermal conducting phase other than AlN which is introduced to the material to be reduced.

Experimental Example 21

The sintered compact material prepared in Experimental example 21, which was prepared using a mixed powder including high proportions of $Al_2O_3$ and $Si_3N_4$, included the 21R phase and the 12H phase. In Experimental example 21, the sintering was performed by hot pressing (20 MPa) because $Y_2O_3$ was not added to the raw material. The material prepared in Experimental example 21, which did not include AlN as a constituent phase, had a sufficiently low thermal conductivity. However, the thermal expansion coefficient of the material was increased to 6.1 ppm/° C., and the difference in thermal expansion coefficient between the material and aluminum nitride was 0.4 ppm/° C.

4. Corrosion Resistance

A specimen of Experimental example 11, which corresponds to an example of the present invention, a specimen (specimen made of aluminum nitride) of Experimental example 1, which corresponds to a comparative example, and a specimen made of mullite were prepared. The specimens had a columnar shape of 15 mm×15 mm×2 mm. One of the 15 mm×15 mm sides of the columnar body was mirror-finished by polishing. The mullite specimen was taken from a sintered compact prepared by forming a commercially available mullite powder (purity: 99.9% or more) into a shape having a diameter of 50 mm and a thickness of about 20 mm and sintering the resulting compact in a hot-press furnace at a pressure of 200 kgf/cm² and 1600° C. for 5 hours in an Ar atmosphere. The mullite specimen had a bulk density of 3.15 g/cm³ and an open porosity of 0.01% or less and was sufficiently densified.

A corrosion resistance test was conducted in the following manner. A part of the mirror-finished surface of each of the specimens was covered with an alumina sintered material, and the remaining part of the mirror-finished surface was exposed. The specimens were exposed at a test temperature of 550° C. and a gas pressure of 0.1 Torr for 5 hours by using an Ar gas as a dilution gas and $NF_3$ as a halogen gas. The height of a step formed between the part of the surface which was exposed to the halogen gas and the part of the surface which was covered with alumina and was not exposed to the halogen gas was measured and considered to be the amount of etching.

The results of the above test confirmed that no significant step was formed, that is, the amount of etching was zero, in the specimens of Experimental example 11 and Experimental example 1, while a step having a height of 0.2 μm was present in the mullite specimen. Thus, a difference in corrosion resistance was confirmed. That is, the resistance to corrosion by halogen gas of the specimen of Experimental example 1, which corresponds to Example of the present invention, was sufficiently higher than that of mullite and comparable to that of the aluminum nitride material. This confirms that the material prepared in Experimental example 11 is highly suitably used as a member for a semiconductor manufacturing apparatus.

II. Experimental Examples 22 to 25

Figure 11:
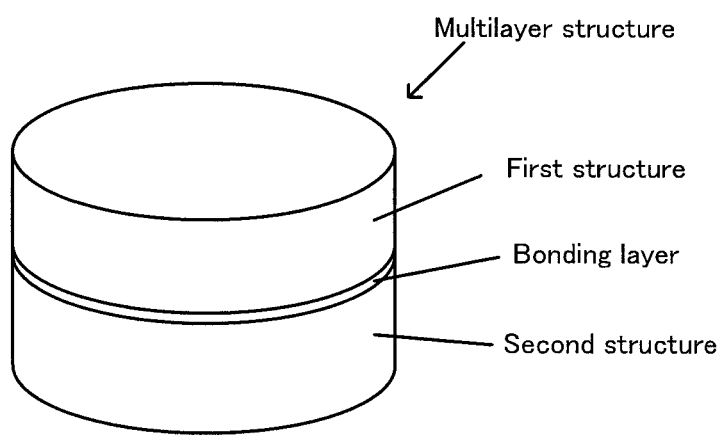
FIG. 11 is a perspective view of a multilayer structure.

In Experimental example 22, a first structure that was the aluminum nitride sintered compact prepared in Experimental example 1 and a second structure that was the sintered compact prepared in Experimental example 11 were each worked into a shape having a diameter of 50 mm and a thickness of 10 mm. To one of the first and second structures, a paste prepared by mixing a powder including 67.3% by mass of aluminium nitride (AlN), 19.0% by mass of magnesium fluoride ($MgF_2$), and 4.7% by mass of aluminium oxide ($Al_2O_3$), a solvent, and an organic binder in appropriate proportions was applied and dried. The other structure was stacked on the structure on which the paste was deposited. The structures were placed in a graphite mold and fired at 1430° C. for 5 hours by hot pressing (load: 60 kgf/cm²). Thus, a multilayer structure was prepared. FIG. 11 illustrates a perspective view of the multilayer structure. In Experimental examples 23 to 25, a multilayer structure was prepared as in Experimental example 22, except that the sintered compacts prepared in Experimental examples 18, 21, and 9 were used as a second structure, respectively.

In the multilayer structures prepared in Experimental examples 22 to 25, cracks and the like were not present apparently and the first and second structures were firmly bonded to each other. However, when the multilayer structures were each cut in a direction perpendicular to the bonding surface, cracking occurred in an end portion of the first structure of the multilayer structure prepared in Experimental example 24 (see Table 4), while cracking did not occur in the multilayer structures prepared in Experimental examples 22, 23, and 25. While the difference in thermal expansion coefficient (ΔCTE) between the first and second structures was 0.3 ppm/° C. or less in the multilayer structures prepared in Experimental examples 22, 23, and 25, the difference in thermal expansion coefficient determined in Experimental example 24 was large, that is, 0.4 ppm/° C. It is considered that this resulted in the generation of thermal stress during the bonding and the stress released when the multilayer was cut caused the occurrence of cracking. Accordingly, the difference in thermal expansion coefficient between the first and second structures is desirably 0.3 ppm/° C. or less in order to bond the structures to each other with further consistency and certainty. Experimental examples 22, 23, and 25 correspond to Examples of the present invention, while Experimental example 24 corresponds to a comparative example.

TABLE 4

| Experimental example | First structure | Second structure | Difference in thermal expansion coefficient between first structure and second strucure ppm/° C. | Crackinig in cross section |
|---|---|---|---|---|
| 22 | Experimental example (AIN base member) | Experimental example 11 (Member including AIN and pseudopolymorph of AIN) | 0.0 | Not occurred |
| 23 | Experimental example (AIN base member) | Experimental example 18 (Member including AIN and pseudopolymorph of AIN) | 0.3 | Not occurred |
| 24 | Experimental example (AIN base member) | Experimental example 21 (Member including pseudopolymorph of AIN and not including AIN) | 0.4 | Occurred |
| 25 | Experimental example (AIN base member) | Experimental example 9 (Member including AIN and pseudopolymorph of AIN) | 0.2 | Not occurred |

The present application claims priority of Japanese Patent Application No. 2015-214956 filed on Oct. 30, 2015, and Japanese Patent Application No. 2016-189843 filed on Sep. 28, 2016, the entire contents of which are incorporated herein by reference.

What is claimed is:

1. A member for a semiconductor manufacturing apparatus which is to be joined to an aluminum nitride base member,
the member being composed of a composite material including principal constituent phases that are aluminum nitride and a pseudopolymorph of aluminum nitride, the pseudopolymorph of aluminum nitride including silicon, aluminum, oxygen, and nitrogen, the pseudopolymorph of aluminum nitride having at least one periodic structure selected from a 27R phase and a 21R phase, the composite material having a thermal conductivity of 50 W/mK or less at room temperature.

2. A member for a semiconductor manufacturing apparatus which is to be joined to an aluminum nitride base member,
the member being composed of a composite material including principal constituent phases that are aluminum nitride and a pseudopolymorph of aluminum nitride, the pseudopolymorph of aluminum nitride including silicon, aluminum, oxygen, and nitrogen,
the pseudopolymorph of aluminum nitride having an X-ray diffraction peak at least at $2\theta=59.8°$ to $60.8°$, the composite material having a thermal conductivity of 50 W/mK or less at room temperature.

3. The member for a semiconductor manufacturing apparatus according to claim 1,
wherein at least one element selected from silicon and oxygen is dissolved in aluminum nitride included in the composite material.

4. The member for a semiconductor manufacturing apparatus according to claim 1,
wherein the mass ratio of Al, N, Si, and O included in the composite material is Al:N:Si:O=59 to 63:29 to 34:1 to 5:2 to 8, with the total mass of Al, N, Si, and O being 100.

5. The member for a semiconductor manufacturing apparatus according to claim 1,
wherein the composite material includes at least one selected from an oxide of a rare-earth metal and an oxynitride of a rare-earth metal, the proportion of the mass of the rare-earth metal element being more than 0 and 3.0 or less, with the total mass of elements other than the rare-earth metal being 100.

6. The member for a semiconductor manufacturing apparatus according to claim 1,
wherein the composite material has a thermal conductivity of 30 W/mK or less at 550° C.

7. The member for a semiconductor manufacturing apparatus according to claim 1,
wherein the composite material has a thermal expansion coefficient of 5.5 to 6.0 ppm/° C. at 40° C. to 1000° C.

8. The member for a semiconductor manufacturing apparatus according to claim 1,
wherein the composite material has an open porosity of 0.5% or less.

9. The member for a semiconductor manufacturing apparatus according to claim 1,
wherein the composite material has a four-point bending strength of 250 MPa or more.

10. The member for a semiconductor manufacturing apparatus according to claim 2,
wherein at least one element selected from silicon and oxygen is dissolved in aluminum nitride included in the composite material.

11. The member for a semiconductor manufacturing apparatus according to claim 2,
wherein the mass ratio of Al, N, Si, and 0 included in the composite material is Al:N:Si:O=59 to 63:29 to 34:1 to 5:2 to 8, with the total mass of Al, N, Si, and O being 100.

12. The member for a semiconductor manufacturing apparatus according to claim 2,
wherein the composite material includes at least one selected from an oxide of a rare-earth metal and an oxynitride of a rare-earth metal, the proportion of the mass of the rare-earth metal element being more than 0 and 3.0 or less, with the total mass of elements other than the rare-earth metal being 100.

13. The member for a semiconductor manufacturing apparatus according to claim 2,
wherein the composite material has a thermal conductivity of 30 W/mK or less at 550° C.

14. The member for a semiconductor manufacturing apparatus according to claim 2,
wherein the composite material has a thermal expansion coefficient of 5.5 to 6.0 ppm/° C. at 40° C. to 1000° C.

15. The member for a semiconductor manufacturing apparatus according to claim 2,
wherein the composite material has an open porosity of 0.5% or less.

16. The member for a semiconductor manufacturing apparatus according to claim 2,
wherein the composite material has a four-point bending strength of 250 MPa or more.

17. A method for producing a member for a semiconductor manufacturing apparatus,
the method comprising mixing together aluminum nitride, alumina, and silicon nitride such that the mass proportions of aluminum nitride, alumina, and silicon nitride to the total mass of aluminum nitride, alumina, and silicon nitride are, by mass, 81% to 95%, 3% to 13%, and 2% to 9%, respectively, in order to prepare a mixed powder, forming the mixed powder into a compact, and firing the compact at 1750° C. to 1850° C. in order to produce the member for a semiconductor manufacturing apparatus according to claim 1.

18. The method for producing a member for a semiconductor manufacturing apparatus according to claim 17,
wherein a rare-earth oxide is added to the mixed powder, the rare-earth oxide serving as a sintering aid.

19. A method for producing a member for a semiconductor manufacturing apparatus,
the method comprising mixing together aluminum nitride, alumina, and silicon nitride such that the mass proportions of aluminum nitride, alumina, and silicon nitride to the total mass of aluminum nitride, alumina, and silicon nitride are, by mass, 81% to 95%, 3% to 13%, and 2% to 9%, respectively, in order to prepare a mixed powder, forming the mixed powder into a compact, and firing the compact at 1750° C. to 1850° C. in order to produce the member for a semiconductor manufacturing apparatus according to claim 2.

20. The method for producing a member for a semiconductor manufacturing apparatus according to claim 19,
wherein a rare-earth oxide is added to the mixed powder, the rare-earth oxide serving as a sintering aid.

21. A heater including a shaft, the heater comprising:
a shaft that is the member for a semiconductor manufacturing apparatus according to claim 1; and
a wafer-supporting heater joined to the shaft, the wafer-supporting heater being composed of an aluminum nitride base material.

22. The heater including a shaft according to claim 21,
wherein a difference in thermal expansion coefficient between the shaft and the wafer-supporting heater is 0.3 ppm/° C. or less at 40° C. to 1000° C.

23. The heater including a shaft according to claim 21,
wherein the shaft and the wafer-supporting heater are joined to each other with a bonding layer interposed therebetween, the bonding layer including aluminum nitride, spinel, and a rare-earth oxyfluoride.

24. A heater including a shaft, the heater comprising:
a shaft that is the member for a semiconductor manufacturing apparatus according to claim 2; and
a wafer-supporting heater joined to the shaft, the wafer-supporting heater being composed of an aluminum nitride base material.

25. The heater including a shaft according to claim 24,
wherein a difference in thermal expansion coefficient between the shaft and the wafer-supporting heater is 0.3 ppm/° C. or less at 40° C. to 1000° C.

26. The heater including a shaft according to claim 24,
wherein the shaft and the wafer-supporting heater are joined to each other with a bonding layer interposed therebetween, the bonding layer including aluminum nitride, spinel, and a rare-earth oxyfluoride.

* * * * *